(12) United States Patent
Zhu et al.

(10) Patent No.: US 12,185,060 B2
(45) Date of Patent: Dec. 31, 2024

(54) ACOUSTIC OUTPUT DEVICES

(71) Applicant: SHENZHEN SHOKZ CO., LTD., Guangdong (CN)

(72) Inventors: Guangyuan Zhu, Shenzhen (CN); Lei Zhang, Shenzhen (CN); Xin Qi, Shenzhen (CN)

(73) Assignee: SHENZHEN SHOKZ CO., LTD., Shenzhen (CN)

( * ) Notice: Subject to any disclaimer, the term of this patent is extended or adjusted under 35 U.S.C. 154(b) by 253 days.

(21) Appl. No.: 18/053,775

(22) Filed: Nov. 9, 2022

(65) Prior Publication Data

US 2023/0328455 A1    Oct. 12, 2023

Related U.S. Application Data

(63) Continuation of application No. PCT/CN2022/085564, filed on Apr. 7, 2022.

(51) Int. Cl.
*H04R 17/00* (2006.01)

(52) U.S. Cl.
CPC ......... *H04R 17/00* (2013.01); *H04R 2460/13* (2013.01)

(58) Field of Classification Search
CPC .. H04R 17/00; H04R 2499/11; H04R 17/005; H04R 2400/03; H04R 2217/01; H04R 2217/03; B06B 1/0292; B06B 1/0644; G06F 3/016; G10K 9/122
See application file for complete search history.

(56) References Cited

U.S. PATENT DOCUMENTS

| | | |
|---|---|---|
| 4,654,654 A | 3/1987 | Kishi |
| 9,093,963 B2 | 7/2015 | Onishi et al. |
| 10,382,869 B2 | 8/2019 | Shimoda |
| 10,838,498 B2 | 11/2020 | Nakano et al. |
| 2007/0177747 A1 | 8/2007 | Onishi et al. |

(Continued)

FOREIGN PATENT DOCUMENTS

| | | |
|---|---|---|
| JP | 2000233157 A | 8/2000 |
| JP | 2012134596 A | 7/2012 |

(Continued)

OTHER PUBLICATIONS

Decision of Grant in Russian Application No. 2022128092 mailed on Mar. 20, 2023, 28 pages.

(Continued)

*Primary Examiner* — Kile O Blair
(74) *Attorney, Agent, or Firm* — METIS IP LLC

(57) ABSTRACT

Embodiments of the present disclosure may provide an acoustic output device, including a first vibration element, a second vibration element, and a piezoelectric element. The piezoelectric element may drive the first vibration element and the second vibration element to generate vibration in response to an electrical signal, wherein the first vibration element may be connected to a first position of the piezoelectric element, the second vibration element may be connected to a second position of the piezoelectric element through at least a first elastic element, the second vibration element may be connected to a third position of the piezoelectric element through at least a second elastic element, and in a vibration direction of the second vibration element, a first elastic coefficient of the first elastic element may be different from a second elastic coefficient of the second elastic element.

20 Claims, 6 Drawing Sheets

(56) References Cited

U.S. PATENT DOCUMENTS

| | | |
|---|---|---|
| 2015/0319526 A1 | 11/2015 | Kunimoto et al. |
| 2018/0124530 A1 | 5/2018 | Bergs et al. |
| 2018/0160209 A1 | 6/2018 | Ogata et al. |
| 2018/0288202 A1 | 10/2018 | Park et al. |
| 2021/0021933 A1 | 1/2021 | Otto et al. |
| 2021/0268544 A1 | 9/2021 | Murase et al. |
| 2021/0392439 A1 | 12/2021 | Ye |

FOREIGN PATENT DOCUMENTS

| | | |
|---|---|---|
| JP | 2012217019 A | 11/2012 |
| JP | 2014007457 A | 1/2014 |
| JP | 2015005897 A | 1/2015 |
| WO | 2021243558 A1 | 12/2021 |

OTHER PUBLICATIONS

The Extended European Search Report in European Application No. 22789820.2 mailed on Jun. 14, 2023, 9 pages.

ACOUSTIC OUTPUT DEVICES

CROSS-REFERENCE TO RELATED APPLICATIONS

This application is a continuation of International Patent Application No. PCT/CN2022/085564, filed on Apr. 7, 2022, the contents of which are hereby incorporated by reference.

TECHNICAL FIELD

The present disclosure relates to the field of acoustic technology, in particular to an acoustic output device.

BACKGROUND

The piezoelectric acoustic output device generates vibration and radiates sound waves outward by utilizing an inverse piezoelectric effect of a piezoelectric material. Compared with a traditional electrically driven speaker, the piezoelectric acoustic output device has the advantages of high electromechanical energy conversion efficiency, low energy consumption, small size, and high integration. With the trend of miniaturization and integration of devices, the piezoelectric acoustic output device has extremely broad prospects and future. However, the piezoelectric acoustic output device has problems such as low sensitivity in a middle and high-frequency band (e.g., a frequency range of 500 Hz to 10 kHz) and various vibration modes in the audible range of human ears (e.g., 20 Hz to 20 kHz), which lead to poor sound quality.

Therefore, it is desirable to provide a piezoelectric acoustic output device to improve its sensitivity in the middle and high-frequency band and reduce its vibration modes in the audible range, thereby improving the sound quality effect of the acoustic output device.

SUMMARY

The embodiment of the present disclosure may provide an acoustic output device, the acoustic output device includes: a first vibration element; a second vibration element; and a piezoelectric element, the piezoelectric element driving the first vibration element and the second vibration element to generate vibration in response to an electrical signal, wherein the first vibration element may be connected to a first position of the piezoelectric element, the second vibration element may be connected to a second position of the piezoelectric element through at least a first elastic element, the second vibration element may be connected to a third position of the piezoelectric element through at least a second elastic element, and in a vibration direction of the second vibration element, a first elastic coefficient of the first elastic element may be different from a second elastic coefficient of the second elastic element.

In some embodiments, the acoustic output device may further include a first connector and a second connector, wherein the first elastic element may be connected to the second position of the piezoelectric element through the first connector, and the second elastic element may be connected to the third position of the piezoelectric element through the second connector.

In some embodiments, the first elastic element may include one or more first elastic rods, and the second elastic element may include one or more second elastic rods.

In some embodiments, a count of the one or more first elastic rods may be the same as a count of the one or more second elastic rods.

In some embodiments, a length of each first elastic rod of the one or more first elastic rods may be different from a length of each second elastic rod of the one or more second elastic rods.

In some embodiments, a material of the one or more first elastic rods is different from a material of the one or more second elastic rods.

In some embodiments, an included angle of every two adjacent first elastic rods in the one or more first elastic rods may be different from an included angle of every two adjacent second elastic rods in the one or more second elastic rods.

In some embodiments, the configuration of each first elastic rod of the one or more first elastic rods may be the same as the configuration of each second elastic rod of the one or more second elastic rods, and a count of the one or more first elastic rods may be different from a count of the one or more second elastic rods.

In some embodiments, the second elastic element may further include a third connector, and the second vibration element may be further connected to the third position of the piezoelectric element through at least the third connector.

In some embodiments, the first elastic element may include one or more first elastic rods, the second elastic element may include a third connector, and the second vibration element may be connected to the third position of the piezoelectric element through the third connector.

In some embodiments, the first elastic coefficient of the first elastic element may be less than the second elastic coefficient of the second elastic element, and the second elastic coefficient of the second elastic element may be greater than $1\times10^4$ N/m.

In some embodiments, a ratio of the second elastic coefficient of the second elastic element to the first elastic coefficient of the first elastic element may be greater than 10.

In some embodiments, in a direction perpendicular to the vibration direction of the second vibration element, the first elastic element may have a third elastic coefficient, and a ratio of the third elastic coefficient to the first elastic coefficient may be greater than $1\times10^4$; or in a direction perpendicular to the vibration direction of the second vibration element, the second elastic element may have a fourth elastic coefficient, and a ratio of the fourth elastic coefficient to the second elastic coefficient may be greater than $1\times10^4$.

In some embodiments, the vibration of the first vibration element and the second vibration element may generate two resonance peaks within an audible range of a human ear.

In some embodiments, the second vibration element, the first elastic element, and the second elastic element may resonate to generate a resonance peak having a lower frequency among the two resonance peaks, and the piezoelectric element and the first vibration element may resonate to generate a resonance peak having a higher frequency among the two resonance peaks.

In some embodiments, a frequency of the peak having the lower frequency among the two resonance peaks may be in a range of 50 Hz-2 kHz, and a frequency of the peak having the higher frequency among the two resonance peaks may be in a range of 1 kHz-10 kHz.

In some embodiments, the piezoelectric element may include a beam-like structure, and the first position may be located at the center of a length-extension direction of the beam-like structure.

In some embodiments, the second position and the third position may be located at two ends of the length-extension direction of the beam-like structure, respectively.

In some embodiments, the vibration may be transmitted to a user in a bone conduction manner through the second vibration element.

In some embodiments, a length of the piezoelectric element may be in a range of 3 mm to 30 mm.

In some embodiments, the piezoelectric element may include two layers of piezoelectric sheets and a substrate, wherein the two layers of piezoelectric sheets may be attached to opposite sides of the substrate, respectively, and the substrate may generate vibration based on an extension and a retraction of the two layers of piezoelectric sheets in a length-extension direction of the beam-like structure.

Additional features may be partially illustrated in the following description and may be obvious to those skilled in the art by referring to the following illustrations and drawings, or may be understood through the generation or operation of examples. The features of the present disclosure may be realized and obtained by practicing or using various aspects of the methods, tools, and combinations set forth in the following detailed examples.

BRIEF DESCRIPTION OF THE DRAWINGS

The present disclosure may be further described according to the exemplary embodiments. The exemplary embodiments may be described in detail with reference to the accompanying drawings. The embodiment is not a limiting exemplary embodiment, wherein the same reference numerals represent similar structures in several views of the drawings, and wherein.

DETAILED DESCRIPTION

Figure 1:
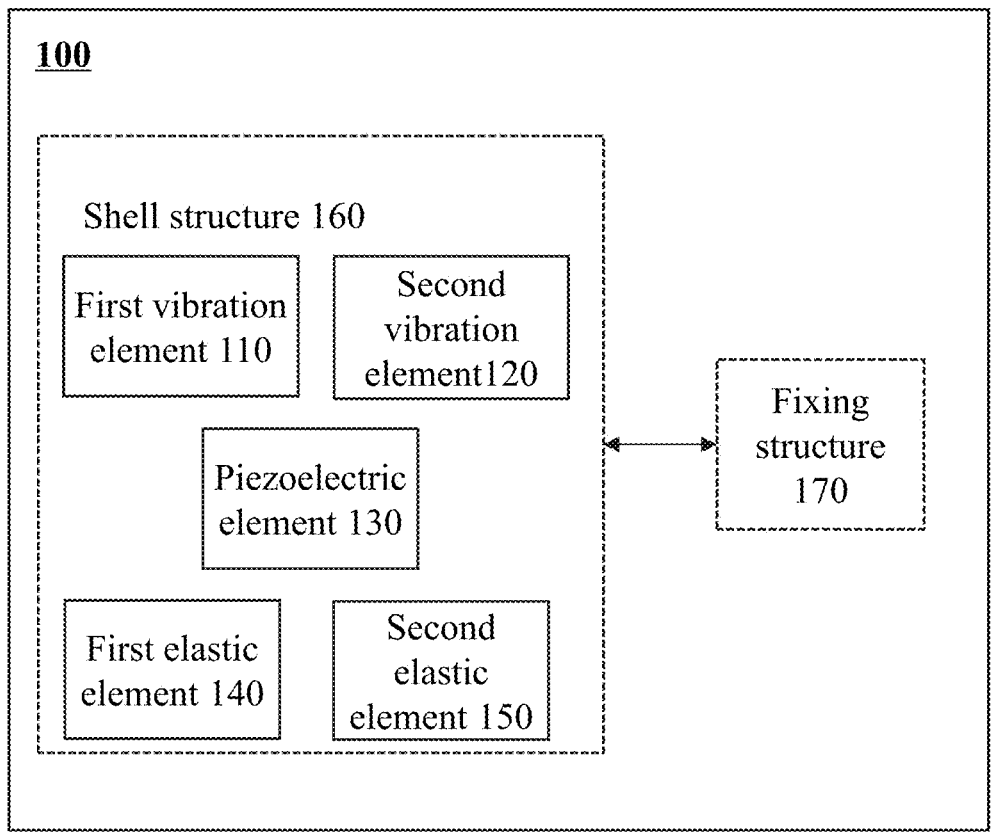
FIG. 1 is a block diagram illustrating a structure of an exemplary acoustic output device according to some embodiments of the present disclosure.

In order to more clearly illustrate the technical solutions related to the embodiments of the present disclosure, a brief introduction of the drawings referred to the description of the embodiments is provided below. Obviously, the drawings in the following description are only some examples or embodiments of the present disclosure, and those skilled in the art may apply this present disclosure to other similar situations based on these drawings and on the premise of not paying creative labor. Unless obviously obtained from the context or the context illustrates otherwise, the same numeral in the drawings refers to the same structure or operation.

It should be understood that the "system," "device," "unit," and/or "module" used herein are one method to distinguish different components, elements, parts, sections, or assemblies of different levels. However, words may be replaced by other expressions if they serve the same purpose.

As shown in the present disclosure and claims, unless the context clearly suggests exceptions, "a," "an," "one" and/or "the" do not specifically refer to the singular, but may also include the plural. In general, the terms "comprise," "comprises," and/or "comprising," "include," "includes," and/or "including," merely prompt to include steps and elements that have been clearly identified, and these steps and elements do not constitute an exclusive listing. The methods or devices may also include other steps or elements. The term "based on" is "based at least in part on." The term "one embodiment" means "at least one embodiment." The term "another embodiment" means "at least one other embodiment."

In the description of the present disclosure, it should be understood that the terms "first," "second," "third" and "fourth" are only used for the purpose of description, and cannot be understood as indicating or implying relative importance or implicitly indicating the number of indicated technical features. Thus, the features defined as "first," "second," "third" and "fourth" may explicitly or implicitly include at least one of the features. In the description of the present disclosure, "a plurality of" means at least two, such as two, three, etc., unless otherwise specifically defined.

In the present disclosure, unless otherwise specified and limited, the terms "connection," "fixation" and other terms shall be interpreted in a broad sense. For example, the term "connection" may refer to fixed connection, detachable connection, integration, mechanical connection, electrical connection, etc. A connection may be a direct connection or an indirect connection through an intermediate medium, an internal communication of two elements, or an interaction relationship of two elements unless otherwise specified. For those of ordinary skilled in the art, the specific meanings of the above terms in the disclosure may be understood according to specific circumstances.

The embodiments of the present disclosure may provide an acoustic output device, the acoustic output device may include a first vibration element, a second vibration element, and a piezoelectric element. The piezoelectric element may drive the first vibration element and the second vibration element to generate vibration in response to an electrical signal. The first vibration element may be connected to a first position of the piezoelectric element, the second vibration element may be connected to a second position of the piezoelectric element through at least a first elastic element, and the second vibration element may be connected to a third position of the piezoelectric element through at least a second elastic element. According to the embodiments of the present disclosure, in a vibration direction of the second vibration element, by making a first elastic coefficient of the first elastic element different from a second elastic coefficient of the second elastic element, the sensitivity of the acoustic output device in a middle and high-frequency band (e.g., 1 kHz-10 kHz) may be improved, thereby facilitating the application of the acoustic output device in special scenarios.

The acoustic output device provided in the embodiments of the present disclosure will be described in detail below in combination with the accompanying drawings.

FIG. 1 is a block diagram illustrating a structure of an exemplary acoustic output device according to some embodiments of the present disclosure. In some embodiments, the acoustic output device 100 may be a bone conduction acoustic output device, an air conduction acoustic output device, or a bone-air conduction combined acoustic output device. In some embodiments, the acoustic output device 100 may include a speaker, a headphone, glasses, a hearing aid, an augmented reality (AR) device, a virtual reality (VR) device, etc., or other devices with audio playback function (e.g., a mobile phone, a computer, etc.). In some embodiments, the acoustic output device 100 may be an open-type acoustic output device. As shown in FIG. 1, the acoustic output device 100 may include a first vibration element 110, a second vibration element 120, a piezoelectric element 130, a first elastic element 140, and a second elastic element 150.

Both the first vibration element 110 and the second vibration element 120 may be mass blocks with certain weights. In some embodiments, the first vibration element 110 and/or the second vibration element 120 may include a vibration plate, a vibration diaphragm, or the like, so that the acoustic output device 100 may output vibration through the first vibration element 110 and/or the second vibration element 120. In some embodiments, a material of a mass block may include but not be limited to metal (e.g., copper, iron, magnesium, aluminum, tungsten, etc.), alloy (e.g., aluminum alloy, titanium alloy, tungsten alloy, etc.), polymer material (e.g., polytetrafluoroethylene, silicone rubber, etc.). In some embodiments, the materials of the first vibration element 110 and the material of the second vibration element 120 may be the same or different. In some embodiments, a weight of the first vibration element 110 and a weight of the second vibration element 120 may be the same or different. In some embodiments, the weight of the first vibration element 110 and/or the second vibration element 120 may be less than 10 g. In some embodiments, the weight of the first vibration element 110 and/or the second vibration element 120 may be less than 8 g. In some embodiments, the weight of the first vibration element 110 and/or the second vibration element 120 may be less than 6 g. In some embodiments, the weight of the first vibration element 110 and/or the second vibration element 120 may be less than 5 g.

Figure 2:
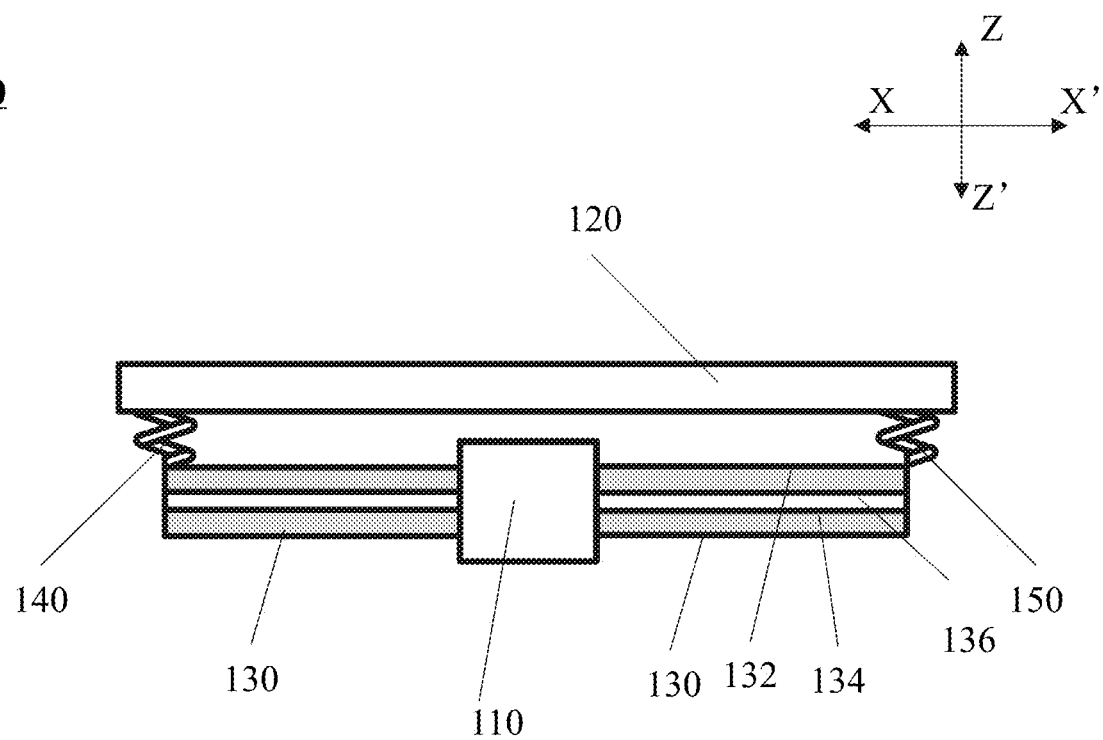
FIG. 2 is a schematic diagram illustrating a structure of an exemplary acoustic output device according to some embodiments of the present disclosure.
Figure 4:
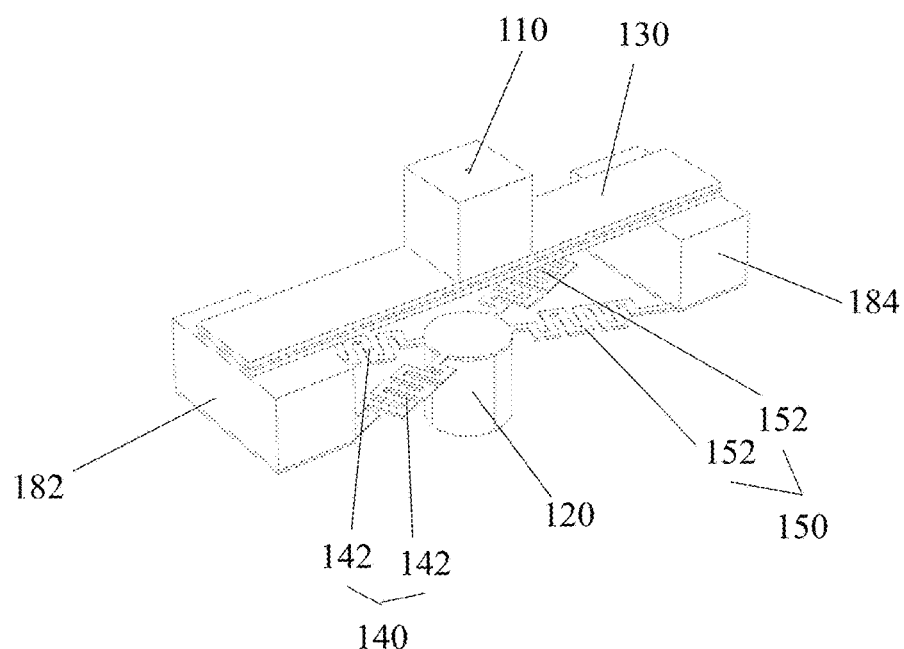
FIG. 4 is a schematic diagram illustrating a structure of an exemplary acoustic output device according to some embodiments of the present disclosure.

The piezoelectric element 130 may be an electric energy conversion device that can convert electric energy into mechanical energy using the inverse piezoelectric effect. In some embodiments, the piezoelectric element 130 may include piezoelectric ceramic, piezoelectric quartz, piezoelectric crystal, piezoelectric polymer, and other materials with piezoelectric effects. In some embodiments, the piezoelectric element 130 may have a regular shape such as a sheet shape, an annular shape, a prismatic shape, a rectangular shape, a columnar shape, a spherical shape, or any combination thereof, or may be in other irregular shapes. In some embodiments, the piezoelectric element 130 may include a beam-like structure (e.g., a strip structure with a certain width) (as shown in FIGS. 2 and 4). For example, the beam-like structure may include two layers of piezoelectric sheets and a substrate, and the two layers of piezoelectric sheets may be attached to opposite sides of the substrate, respectively. The substrate may generate vibration (e.g., vibrate in a direction perpendicular to the surface of the substrate) based on an extension and a retraction of the two-layer piezoelectric sheets in a length-extension direction of the beam-like structure. As used herein, the length-extension direction of the beam-like structure of the piezoelectric element 130 may refer to a direction in which the feature size of the beam-like structure in this extension direction is greater than the feature size of the beam-like structure in any other direction. In some embodiments, the beam-like structure may include a linear beam-like structure, a curved beam-like structure, or the like. In the present disclosure, the linear beam-like structure may be described as an example, and this is not intended to limit the scope of the present disclosure. For more descriptions of the beam-like structure, please refer to FIG. 2 and the descriptions thereof.

The first vibration element 110 may be physically connected (e.g., glued, clamped, threaded, welded, etc.) to the first position of the piezoelectric element 130. The second vibration element 120 may be connected to the second position of the piezoelectric element 130 through at least the first elastic element 140 and connected to the third position of the piezoelectric element 130 through at least the second elastic element 150. In other words, one end of the first elastic element 140 may be connected to the second position of the piezoelectric element 130, one end of the second elastic element 150 may be connected to the third position of the piezoelectric element 130, and another end of the first elastic element 140 and another end of the second piezoelectric element 150 may be connected to the second vibration element 120 simultaneously. The piezoelectric element 130 may be deformed by a driving voltage (or an excitation signal), and generate the vibration. The first vibration element 110 and the second vibration element 120 may generate vibration in response to the vibration of the piezoelectric element 130, respectively. Specifically, the piezoelectric element 130 may directly transmit the vibration to the first vibration element 110, and the vibration of the piezoelectric element 130 may be transmitted to the second vibration element 120 through the first elastic element 140 and the second elastic element 150. That is, the second vibration element 120 may receive the vibration transmitted by the first elastic element 140 and the second elastic element 150 simultaneously. In the embodiments of the present disclosure, the first vibration element 110 directly connected to the piezoelectric element 130 may be referred to as a mass end, and the second vibration element 120 connected to the piezoelectric element 130 through the first elastic element 140 and the second elastic element 150 may be referred to as an elastic mass end.

Figure 5:
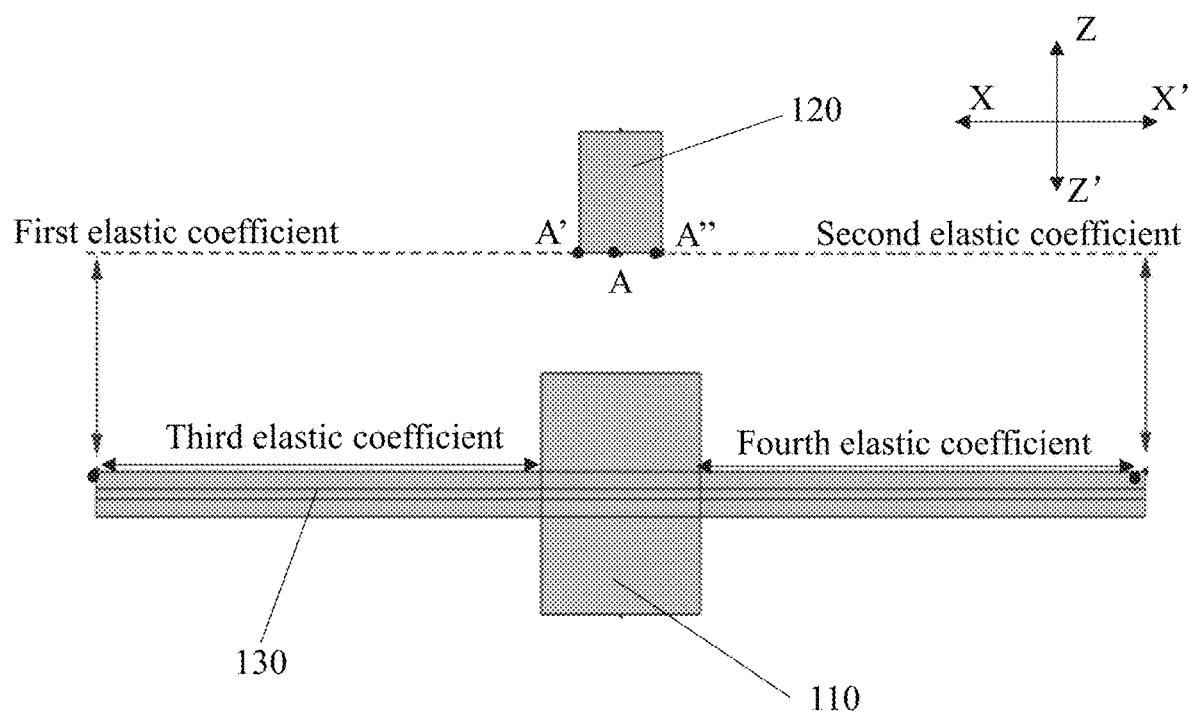
FIG. 5 illustrates a simulation model of an exemplary acoustic output device according to some embodiments of the present disclosure.

In some embodiments, the first elastic element 140 and the second elastic element 150 may be connected to the same position or different positions of the second vibration element 120. For example, as shown in FIG. 5, the first elastic element 140 and the second elastic element 150 may be connected to the middle position A of the second vibration element 120 simultaneously. As another example, as shown in FIG. 5, the first elastic element 140 may be connected to position A' of the second vibration element 120, and the second elastic element 150 may be connected to position A" of the second vibration element 120.

In some embodiments, if the piezoelectric element 130 includes a beam-like structure, the first position may be located at the center of the length-extension direction of the beam-like structure. The second position and the third position may be located at two ends of the beam-like structure in the length-extension direction, respectively. In some embodiments, the second position and the third position may be located at any two positions symmetrical or asymmetrical about the center of the length-extension direction of the beam-like structure. In some embodiments, the piezoelectric element 130 may be in a regular shape such as a circle, a triangle, a pentagon, a hexagon, or another irregular shape. For example, when the shape of the piezoelectric element 130 is a circle, the first position may be the center of the circle, and the second position and the third position may be located at two radial ends of the circle. As another example, when the shape of the piezoelectric element 130 is an irregular shape, the first position may be the centroid of the irregular shape, and the second position and the third position may be two positions on e.g., the edge of the irregular shape that are symmetric or asymmetric with respect to the centroid. In the present disclosure, for convenience of description, a piezoelectric element having a beam-like structure may be taken as an example of the piezoelectric element 130.

In some embodiments, the first elastic element 140 and the second elastic element 150 may be directly connected to the second position and the third position of the piezoelectric element 130 (e.g., by gluing, welding, clamping, etc.). In some embodiments, the acoustic output device 100 may further include a first connector and a second connector (not shown). The second vibration element 120 and the first elastic element 140 may be connected to the second position of the piezoelectric element 130 through the first connector. The second vibration element 120 and the second elastic element 150 may be connected to the third position of the piezoelectric element 130 through the second connector. For example, as shown in FIG. 4, the second vibration element 120 and the first elastic element 140 may be connected to the first end (i.e., the second position) of the piezoelectric element 130 through a first connector 182. The second vibration element 120 and the second elastic element 150 may be connected to the second end (i.e., the third position) of the piezoelectric element 130 through a second connector 184.

In the vibration direction of the second vibration element 120, the first elastic coefficient of the first elastic element 140 and the second elastic coefficient of the second elastic element 150 may be different. In some embodiments, the materials of the first elastic element 140 and/or the second elastic element 150 may be any material having the ability to transmit vibration. For example, the materials of the first elastic element 140 and/or the second elastic element 150 may be silicone, foam, plastic, rubber, metal, etc., or any combination thereof. In some embodiments, the first elastic element 140 and/or the second elastic element 150 may be components with good elasticity (i.e., prone to undergo elastic deformation). For example, the first elastic element 140 and/or the second elastic element 150 may include a spring (e.g., an air spring, a mechanical spring, an electromagnetic spring, etc.), a vibration-transmission piece, an elastic piece, a substrate, etc., or any combination thereof. In some embodiments, the first elastic element 140 and/or the second elastic element 150 may include one or more elastic rods (e.g., a first elastic rod 142 and/or a second elastic rod 152 shown in FIG. 4). The second vibration element 120 may be connected to one or more elastic rods to realize the connection with the second position and/or the third position of the piezoelectric element 130. In some embodiments, the first elastic coefficient of the first elastic element 140 may be different from the second elastic coefficient of the second elastic element 150 by adjusting the length, the material of the first elastic element 140 and/or the second elastic element 150, or the count, the length, the material, the included angle, etc., or any combination thereof, of the elastic rods included therein. For more descriptions about the first elastic element 140 and/or the second elastic element 150, please refer to other parts of the present disclosure (e.g., FIG. 2, FIG. 4, and their descriptions), which are not repeated here.

In some embodiments, the vibrations of the first vibration element 110 and the second vibration element 120 may generate two resonance peaks in the audible frequency range of human ears (e.g., 20 Hz-20 kHz). Specifically, the second vibration element 120, the first elastic element 140, and the second elastic element 150 may resonate to generate a first resonance peak (e.g., the resonance peak in the dotted circle M in FIG. 3) having a lower frequency (e.g., 50 Hz-2000 Hz) among the two resonance peaks. The piezoelectric element 130 and the first vibration element 110 may resonate to generate a second resonance peak (e.g., the resonance peak in the dotted circle N in FIG. 3) having a higher frequency (e.g., 1 kHz-10 kHz) among the two resonance peaks. The frequency (also be referred to as a second resonance frequency) corresponding to the second resonance peak may be higher than the frequency (also be referred to as a first resonance frequency) corresponding to the first resonance peak.

In some embodiments, the frequency range of the first resonance frequency corresponding to the first resonance peak and/or the second resonance frequency corresponding to the second resonance peak may be adjusted by adjusting the weight of the second vibration element 120 and the elastic coefficient (e.g., the first elastic coefficient and/or the second elastic coefficient) of the first elastic element 140 and/or the second elastic element 150. In some embodiments, the frequency range of the first resonance frequency may be 20 Hz-2000 Hz. In some embodiments, the frequency range of the first resonance frequency may be 50 Hz-1500 Hz. In some embodiments, the frequency range of the first resonance frequency may be 100 Hz-1000 Hz. In some embodiments, the frequency range of the first resonance frequency may be 150 Hz-500 Hz. In some embodiments, the frequency range of the first resonance frequency may be 150 Hz-200 Hz.

In some embodiments, the frequency range of the second resonance frequency corresponding to the second resonance peak may be adjusted by adjusting performance parameters of the piezoelectric element 130. In some embodiments, the performance parameters of the piezoelectric element 130 may include a geometric parameter, a material parameter, or the like. Exemplary geometric parameters may include a thickness, a length, or the like. Exemplary material parameters may include an elastic modulus, a density, or the like. In some embodiments, the second resonance frequency may be the natural frequency of the piezoelectric element 130. In some embodiments, the frequency range of the second resonance frequency may be 1 kHz-10 kHz. In some embodiments, the frequency range of the second resonance frequency may be 1 kHz-9 kHz. In some embodiments, the frequency range of the second resonance frequency may be 1 kHz-8 kHz. In some embodiments, the frequency range of the second resonance frequency may be 1 kHz-7 kHz. In some embodiments, the frequency range of the second resonance frequency may be 1 kHz-6 kHz. In some embodiments, the frequency range of the second resonance frequency may be 2 kHz-5 kHz. In some embodiments, the frequency range of the second resonance frequency may be 3 kHz-4 kHz.

In some embodiments, a damping may be added to one or more elements in the acoustic output device 100 to make the resonance peaks of the acoustic output device 100 smoother. For example, the first elastic element 140 and/or the second elastic element 150 may be made of a material with a greater damping effect (e.g., silicone, rubber, foam, etc.). As another example, a damping material may be coated on the piezoelectric element 130. As still another example, the damping material or an electromagnetic damping may be coated on the first vibration element 110 and/or the second vibration element 120.

In some embodiments, the vibration of the piezoelectric element 130 (or the acoustic output device 100) may be transmitted to the user by a bone conduction mode through the first vibration element 110 and/or the second vibration element 120. For example, the second vibration element 120 may directly contact the skin of the user's head, and the vibration of the piezoelectric element 130 may be transmitted to the bones and/or muscles of the user's face through the second vibration element 120, and finally to the user's ears. As another example, the second vibration element 120 may be not in direct contact with the human body, and the vibration of the piezoelectric element 130 may be transmitted to the shell of the acoustic output device through the second vibration element 120, and then transmitted to the bones and/or muscles of the user's face by the shell, and finally transmitted to the user's ears. In some embodiments, the vibration of the piezoelectric element 130 may also be transmitted to the user by an air conduction mode through the first vibration element 110 and/or the second vibration element 120. For example, the second vibration element 120 may directly drive the air around it to generate vibration, so as to transmit the vibration to the user's ear through the air. As another example, the second vibration element 120 may be further connected to the vibration diaphragm, and the vibration of the second vibration element 120 may be transmitted to the vibration diaphragm, and then the vibration diaphragm drives the air to generate vibration, so as to transmit the vibration to the user's ear through the air.

In some embodiments, the acoustic output device 100 may further include a shell structure 160. The shell structure 160 may be configured to carry other components of the acoustic output device 100 (e.g., the first vibration element 110, the second vibration element 120, the piezoelectric element 130, the first elastic element 140, or the second elastic element 150, etc.). In some embodiments, the shell structure 160 may have a closed structure or semi-closed structure with a hollow interior, and the other components of the acoustic output device 100 may be located in or on the shell structure 160. In some embodiments, the shell structure 160 may have a regular structure such as a cuboid, a cylinder, and a circular table, or an irregular three-dimensional structure. When the user wears the acoustic output device 100, the shell structure 160 may be located near the user's ear. For example, the shell structure 160 may be located at the peripheral side (e.g., the front side or the rear side) of the user's auricle. As another example, the shell structure 160 may be located on the user's ear without blocking or covering the user's ear canal. In some embodiments, the acoustic output device 100 may be a bone conduction earphone, and at least one side of the shell structure 160 may be in contact with the user's skin. Acoustic driver components in the bone conduction earphone (e.g., the combination of the piezoelectric element 130, the first vibration element 110, the first elastic element 140, the second elastic element 150, and the second vibration element 120) may convert an audio signal into mechanical vibration, and the mechanical vibration may be transmitted to the user's auditory nerve through the shell structure 160 and the user's bones. In some embodiments, the acoustic output device 100 may be an air conduction earphone, and at least one side of the shell structure 160 may or may not contact the user's skin. A side wall of the shell structure 160 may include at least one sound guiding hole. The acoustic driver components in the air conduction earphone may convert an audio signal into an air conduction sound, and the air conduction sound may be radiated in the direction of the user's ear through the sound guiding hole.

In some embodiments, the acoustic output device 100 may include a fixing structure 170. The fixing structure 170 may be configured to fix the acoustic output device 100 near the user's ear. In some embodiments, the fixing structure 170 may be physically connected with the shell structure 160 of the acoustic output device 100 (e.g., by gluing, welding, clamping, etc.). In some embodiments, the shell structure 160 of the acoustic output device 100 may be part of the fixing structure 170. In some embodiments, the fixing structure 170 may include an ear hook, a back hook, an elastic band, a glasses leg, etc., so that the acoustic output device 100 may be better fixed near the user's ear to prevent the acoustic output device 100 from falling off when the user is wearing the acoustic output device 100. For example, the fixing structure 170 may be an ear hook configured to be worn around the ear region. In some embodiments, the ear hook may be a continuous hook-shaped structure and be elastically stretched to be worn on the user's ear. Meanwhile, the ear hook may also exert a pressure on the user's auricle so that the acoustic output device 100 may be firmly fixed at a specific position of the user's ear or head. In some embodiments, the ear hook may be a discontinuous band. For example, the ear hook may include a rigid portion and a flexible portion. The rigid portion may be made of a rigid material (e.g., plastic or metal). The rigid portion may be fixed to the shell structure 160 of the acoustic output device 100 by physical connection (e.g., snap connection, screw connection, etc.). The flexible portion may be made of an elastic material (e.g., cloth, composite material, and/or neoprene). As another example, the fixing structure 170 may be a neck band configured to be worn around the neck/shoulder region. As still another example, the fixing structure 170 may be a glasses leg, which is a part of the glasses, may be put on the user's ear.

It should be noted that the above description of FIG. 1 may be provided only for illustrative purposes and may be not intended to limit the scope of the present disclosure. For those skilled in the art, various changes and modifications may be made according to the guidance of the present disclosure. For example, in some embodiments, the acoustic output device 100 may further include one or more components (e.g., a signal transceiver, an interaction module, a battery, etc.). In some embodiments, one or more components of the acoustic output device 100 may be replaced by other elements capable of performing similar functions. For example, the acoustic output device 100 may not include the fixing structure 170, and the shell structure 160 or a part thereof may be a shell structure having a human ear fitting shape (e.g., a circular ring, an oval, a polygon (regular or irregular), a U-shape, a V-shape, and a semicircle) so that the shell structure 160 may be hung near the user's ear. These changes and modifications will not depart from the scope of the present disclosure.

FIG. 2 is a schematic diagram illustrating a structure of an exemplary acoustic output device according to some embodiments of the present disclosure. As shown in FIG. 2, the acoustic output device 200 may include the first vibration element 110, the second vibration element 120, the piezoelectric element 130, the first elastic element 140, and the second elastic element 150. The piezoelectric element 130 may include the beam-like structure. In some embodiments, the length of the piezoelectric element 130 (i.e., a size along the length-extending direction of the beam-like structure) may be in the range of 3 mm to 30 mm. In some embodiments, the length of the piezoelectric element 130 may be in the range of 3 mm to 25 mm. In some embodiments, the length of the piezoelectric element 130 may be in the range of 3 mm to 20 mm. In some embodiments, the length of the piezoelectric element 130 may be in the range of 3 mm to 18 mm. In some embodiments, the length of the piezoelectric element 130 may be in the range of 3 mm to 15 mm. In some embodiments, the length of the piezoelectric element 130 may be in the range of 3 mm to 10 mm.

In some embodiments, as shown in FIG. 2, the piezoelectric element 130 may include two piezoelectric sheets (i.e., a piezoelectric sheet 132 and a piezoelectric sheet 134) and a substrate 136. The substrate 136 may be configured as a carrier for carrying components and an element that deforms in response to the vibration. In some embodiments, the material of the substrate 136 may include one or more combinations of metal (e.g., copper-clad foil, steel, etc.), phenolic resin, crosslinked polystyrene, or the like. In some embodiments, the shape of the substrate 136 may be determined according to the shape of the piezoelectric element 130. For example, if the piezoelectric element 130 is a piezoelectric cantilever beam, the substrate 136 may be in an elongated shape. As another example, if the piezoelectric element 130 is a piezoelectric diaphragm, the substrate 136 may be in a plate shape or a sheet shape.

The piezoelectric sheet 132 and the piezoelectric sheet 134 may be components that provide the piezoelectric effect and/or the inverse piezoelectric effect. In some embodiments, the piezoelectric sheet may cover one or more surfaces of the substrate 136 and deform under the action of a driving voltage to drive the substrate 136 to deform, thereby realizing the output vibration of the piezoelectric element 130. For example, along a thickness direction of the piezoelectric element 130 (as shown by arrow ZZ'), the piezoelectric sheet 132 and the piezoelectric sheet 134 are attached to opposite sides of the substrate 136, respectively. The substrate 136 may generate vibration according to the extension and the retraction of the piezoelectric sheet 132 and the piezoelectric sheet 134 along the length-extension direction of the piezoelectric element 130 (as shown by arrow XX'). Specifically, when power is applied along the thickness direction ZZ' of the piezoelectric element 130, the piezoelectric sheet on one side of the substrate 136 may retract along its length-extension direction, and the piezoelectric sheet on the other side of the substrate 136 may extend along its length-extension direction, thereby driving the substrate 136 to bend and generate the vibration in a direction perpendicular to the surface of the substrate 136 (i.e., the thickness direction ZZ').

In some embodiments, the material of the piezoelectric sheet 132 and/or the piezoelectric sheet 134 may include piezoelectric ceramic, piezoelectric quartz, a piezoelectric crystal, piezoelectric polymer, or the like, or any combination thereof. Exemplary piezoelectric crystals may include crystal, sphalerite, boracite, tourmaline, zincite, Gallium Arsenide (GaAs), barium titanate and its derived structure crystal, Potassium dihydrogen phosphate ($KH_2PO_4$), roshi salt ($NaKC_4H_6O_6·4H_2O$), or the like. Exemplary piezoelectric ceramic materials may include barium titanate (BT), lead zirconate titanate (PZT), lead barium lithium niobate (PBLN), modified lead titanate (PT), aluminum nitride (AlN), zinc oxide (ZnO), or the like, or any combination thereof. Exemplary piezoelectric polymer materials may include polyvinylidene difluoride (PVDF), or the like.

The first vibration element 110 may be connected to the first position of the piezoelectric element 130. The second vibration element 120 may be connected to the second position of the piezoelectric element 130 through the first elastic element 140 and to the third position of the piezoelectric element 130 through the second elastic element 150. It should be noted that when the piezoelectric element 130 having the beam-like structure vibrates, the amplitude of the ends of the piezoelectric element 130 may be greater. Therefore, when the first position, the second position, and/or the third position are located at the ends of the beam-like structure, the output response sensitivity of the corresponding vibration element may be higher and the sound quality may be better.

In some embodiments, the first position may be located at the center of the length-extension direction of the beam-like structure, the second position may be located at one end of the length-extension direction of the beam-like structure, and the third position may be located at the other end of the length-extension direction of the beam-like structure. In such cases, the piezoelectric element 130 may have a symmetric structure, and the plane passing through the first position and perpendicular to the length-extension direction of the beam-like structure may be the symmetry plane of the symmetric structure. For example, as shown in FIG. 2, the first vibration element 110 may be attached to a central position (i.e., the first position) of the first surface in the length-extension direction of the piezoelectric element 130. The first elastic element 140 may be attached to one end (i.e., the second position) of the second surface opposite to the first surface in the length-extension direction of the piezoelectric element 130. The second elastic element 150 may be attached to the other end (i.e., the third position) of the second surface opposite to the first surface in the length-extension direction of the piezoelectric element 130. In some embodiments, the piezoelectric element 130 may include two sub-piezoelectric elements. One end of each sub-piezoelectric element may be connected to the first vibration element 110. The other end of each sub-piezoelectric element may be connected to the second vibration element 120 through the first elastic member 140 and the second elastic member 150, respectively. In some embodiments, the two sub-piezoelectric elements may be in a straight line. The two sub-piezoelectric elements may be symmetrically arranged on a plane passing through the center of the first vibration element 110 and perpendicular to the length-extension direction of the beam-like structure. In this case, the center of the first vibration element 110 may be regarded as the central position of the piezoelectric element including the two sub-piezoelectric elements. The first vibration element 110 may be connected to the central position of the piezoelectric element, i.e., the first position.

In some embodiments, the acoustic output device 200 may further include one or more connectors (not shown), and two components of the acoustic output device 200 may be connected by a connector. For example, the second vibration element 120 and the first elastic element 140 may be connected to the second position of the piezoelectric element 130 through the connector. As another example, the second vibration element 120 and the second elastic element 150 may be connected to the third position of the piezoelectric element 130 through the connector. The connector may be disposed at the second position (or the third position) of the piezoelectric element 130, one end of the first elastic element 140 (or the second elastic element 150) may be connected to the connector, and the other end of the first elastic element 140 (or the second elastic element 150) may be connected to the second vibration element 120. The arrangement of the connector may make the vibration at the second position or the third position of the piezoelectric element 130 be transmitted to the first elastic element 140 or the second elastic element 150 and the second vibration element 120, and also make the structure of the first elastic element 140 and/or the second elastic element 150 more flexible. For example, as shown in FIG. 2, the second vibration element 120 may be a vibration plate having the same shape as the piezoelectric element 130. The vibration plate and the piezoelectric element 130 may be arranged opposite each other. The first elastic element 140 and/or the second elastic element 150 may be springs (e.g., a mechanical spring, an electromagnetic spring, etc.), or rods made of other materials with a small elastic coefficient. The first elastic element 140 and/or the second elastic element 150 may be vertically disposed between the second vibration element 120 and the piezoelectric element 130. In this case, the first elastic element 140 may have the first elastic coefficient in the vibration direction of the second vibration element 120, and the second elastic element 150 may have the second elastic coefficient in the vibration direction of the second vibration element 120. As another example, as shown in FIG. 4, the first elastic element 140 and/or the second elastic element 150 may include a plurality of elastic rods (e.g., the first elastic rod 142 or the second elastic rod 152). The elastic rods may be connected to the piezoelectric element 130 through the first connector 182 and the second connector 184. The elastic rods may be connected between the piezoelectric element 130 and the second vibration element 120 in an oblique or parallel manner with respect to the piezoelectric element 130. In this case, the first elastic rod may have the first elastic coefficient in the vibration direction of the second vibration element 120, and the first elastic rod may also have a third elastic coefficient in the direction perpendicular to the vibration direction of the second vibration element 120. The second elastic rod may have the second elastic coefficient in the vibration direction of the second vibration element 120, and the second elastic rod may also have a fourth elastic coefficient in the direction perpendicular to the vibration direction of the second vibration element 120. For more description of the elastic rods, please refer to FIG. 4 and the descriptions thereof, which are not repeated here.

Figure 3:
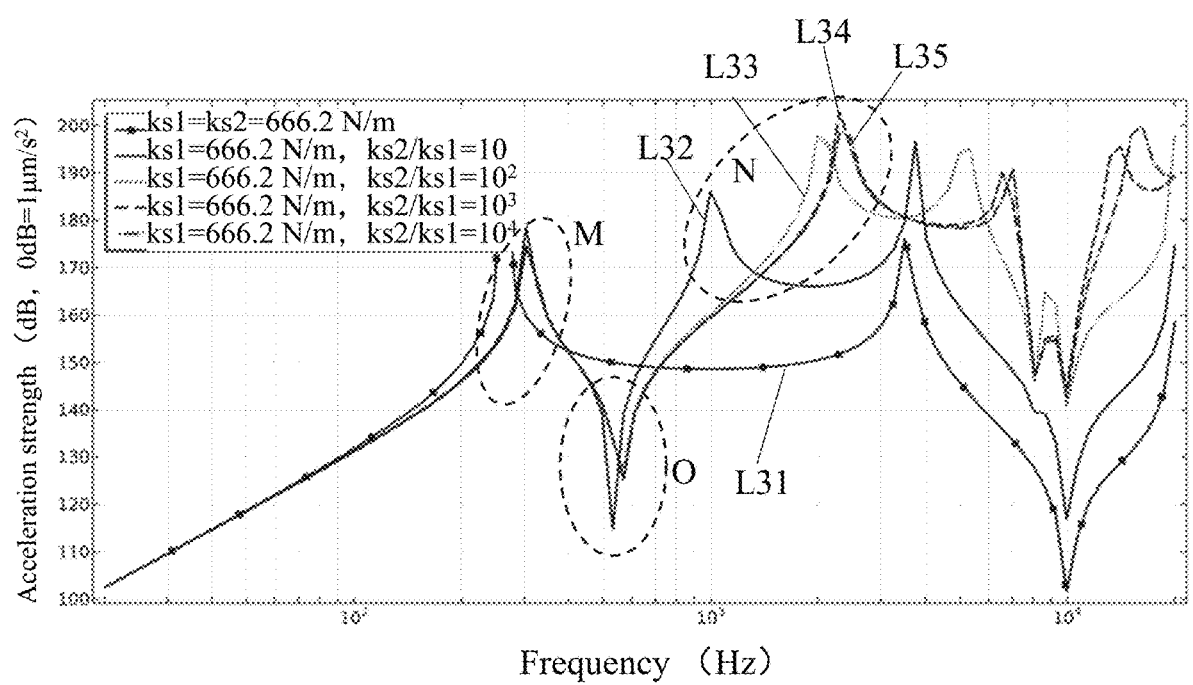
FIG. 3 illustrates frequency response curves of exemplary acoustic output devices when a vibration signal is output from an elastic mass end according to some embodiments of the present disclosure.

The first elastic coefficient of the first elastic element 140 and the second elastic coefficient of the second elastic element 150 may be different. In some embodiments, a difference between the first elastic coefficient of the first elastic element 140 and the second elastic coefficient of the second elastic element 150 may affect the frequency response curve of the acoustic output device 200 (as shown in FIG. 3). In some embodiments, the second elastic coefficient may be greater than the first elastic coefficient. A ratio of the second elastic coefficient to the first elastic coefficient may be greater than 10. In some embodiments, in order to ensure that the acoustic output device 200 has a higher sensitivity and a flat frequency response curve in the range of 1.5 kHz-3 kHz, a ratio of the second elastic coefficient to the first elastic coefficient may be in a range of 10-50. In some embodiments, in order to ensure that the acoustic output device 200 has a higher sensitivity and a flat frequency response curve in the range of 2.5 kHz-4 kHz, a ratio of the second elastic coefficient to the first elastic coefficient may be in a range of 50-100. In some embodiments, in order to ensure that the acoustic output device 200 has a higher sensitivity and a flat frequency response curve in a range of 3 kHz-5 kHz, a ratio of the second elastic coefficient to the first elastic coefficient may be in a range of 100-1000. In some embodiments, the second elastic coefficient may be much greater than the first elastic coefficient. For example, the first elastic element 140 arranged as shown in FIG. 2 may be a spring, and the second elastic element 150 may be a rod that is made of a material having a large elastic modulus (e.g., metal). In other words, the second vibration element 120 may be rigidly connected to the piezoelectric element 130 through the rod, instead of being elastically connected to the piezoelectric element 130 through the spring.

FIG. 3 illustrates frequency response curves of exemplary acoustic output devices when a vibration signal is output from an elastic mass end according to some embodiments of the present disclosure. As shown in FIG. 3, curve L31 may represent a frequency response curve of an acoustic output device (e.g., the acoustic output device 200) when a first elastic coefficient ks1 of the first elastic element and a second elastic coefficient ks2 of the second elastic element are the same and the vibration signal is output from the elastic mass end. Curve L32 may represent a frequency response curve of an acoustic output device when a ratio of the second elastic coefficient ks2 of the second elastic element to the first elastic coefficient ks1 of the first elastic element is 10 and the vibration signal is output from the elastic mass end. Curve L33 may represent a frequency response curve of an acoustic output device when a ratio of the second elastic coefficient ks2 of the second elastic element to the first elastic coefficient ks1 of the first elastic element is 100, and the vibration signal is output from the elastic mass end. Curve L34 may represent a frequency response curve of an acoustic output device when a ratio of the second elastic coefficient ks2 of the second elastic element to the first elastic coefficient ks1 of the first elastic element is 1000, and the vibration signal is output from the elastic mass end. Curve L35 may represent a frequency response curve of an acoustic output device when a ratio of the second elastic coefficient ks2 of the second elastic element to the first elastic coefficient ks1 of the first elastic element is 10000, and the vibration signal is output from the elastic mass end. Merely by way of example, as shown in FIG. 3, the first elastic coefficient ks1 of the first elastic element corresponding to each frequency response curve is the same and is 666.2 N/m.

As shown in FIG. 3, the curves L31, L32, L33, L34, and L35 all may have two resonance peaks in a range of 100 Hz to 5000 Hz (which is within the audible range of human ears). The first resonance peak in the dotted circle M may be generated by resonance of the second vibration element 120, the first elastic element 140, and the second elastic element 150. The second resonance peak in the dotted circle N may be generated by resonance of the first vibration element 110 and the piezoelectric element 130. As can be seen from FIG. 3, when the first elastic coefficient ks1 of the first elastic element 140 is equal to the second elastic coefficient ks2 of the second elastic element 150 (corresponding to the curve L31), a curve between the first resonance peak and the second resonance peak may be flat and may have no peak or valley, but its sensitivity may be low. Keeping the first elastic coefficient ks1 unchanged and increasing the second elastic coefficient ks2, in other words, the acoustic output device 200 may change from an elastically symmetric acoustic output device (corresponding to the curve L31) to an elastically asymmetric acoustic output device (e.g., corresponding to the curve L32), the first resonance frequency corresponding to the first resonance peak (resonance peak in the dotted circle M) of the acoustic output device 200 slightly increases, and after the first resonance peak, a resonance valley (i.e., a resonance valley in the dotted circle O) may be generated.

With the further increase of the second elastic coefficient ks2 (corresponding to curves L32 to L35), the position of the first resonance peak may be almost unchanged, and the frequency corresponding to the resonance valley after the first resonance peak may hardly change with the increase of the second elastic coefficient ks2. Therefore, the position of the resonance valley may be determined by the elastic element having a smaller elastic coefficient. With the increase of the second elastic coefficient ks2, the second resonance peak (i.e., the resonance peak in the dotted circle N) gradually moves to the high frequency, and the frequency response amplitude after the second resonance peak may be significantly increased. In other words, the acoustic output device 200 may have a high sensitivity in the middle and high-frequency band (e.g., 1 kHz-10 kHz). When the second elastic coefficient ks2 is increased to 1000 times the first elastic coefficient ks1, the second elastic coefficient ks2 is continuously increased, and the frequency response curve of the acoustic output device 200 may be basically unchanged (e.g., as shown by curves L34 and L35).

To sum up, when the second elastic coefficient ks2 and the first elastic coefficient ks1 are different, the acoustic output device 200 may have the higher sensitivity in the middle and high-frequency band. As the difference between the second elastic coefficient ks2 and the first elastic coefficient ks1 increases, the sensitivity of the acoustic output device 200 in the middle and high-frequency band may improve. In some embodiments, when the difference between the second elastic coefficient ks2 and the first elastic coefficient ks1 exceeds a certain value (e.g., the ratio between the second elastic coefficient ks2 and the first elastic coefficient ks1 is more than 1000 times), the frequency response of the acoustic output device 200 in the middle and high-frequency band may be basically unchanged, that is, the sensitivity of the acoustic output device 200 in the middle and high-frequency band will not continue to improve.

FIG. 4 is a schematic diagram illustrating a structure of an exemplary acoustic output device according to some embodiments of the present disclosure. FIG. 5 illustrates a simulation model of an exemplary acoustic output device according to some embodiments of the present disclosure. As shown in FIG. 4, the acoustic output device 400 may have a structure similar to that of the acoustic output device 200. For example, the acoustic output device 400 may include the first vibration element 110, the second vibration element 120, the piezoelectric element 130, the first elastic element 140, and the second elastic element 150. As another example, the piezoelectric element 130 may include the beam-like structure. The first vibration element 110 may be connected at the central position (i.e., the first position) in the length-extension direction of the beam-like structure. The second vibration element 120 may be connected to two ends (i.e., the second position and the third position) in the length-extension direction of the beam-like structure by the first elastic element 140 and the second elastic element 150. In the present disclosure, for convenience of description, the first position may be the central position of the beam-like structure, and the second position and the third position may be two ends of the beam-like structure in the length-extension direction.

In some embodiments, the acoustic output device 400 may further include the first connector 182 and the second connector 184. The second vibration element 120 and the first elastic element 140 may be connected to the second position of the piezoelectric element 130 through the first connector 182. The first connector 182 may be disposed at the second position of the piezoelectric element 130, one end of the first elastic element 140 may be connected to the first connector 182, and the other end of the first elastic element 140 may be connected to the second vibration element 120. Similarly, the second vibration element 120 and the second elastic element 150 may be connected to the third position of the piezoelectric element 130 through the second connector 184. The second connector 184 may be disposed at the third position of the piezoelectric element 130, one end of the second elastic element 150 may be connected to the second connector 184, and the other end of the second elastic element 150 may be connected to the second vibration element 120.

In some embodiments, at least one of the first elastic element 140 and the second elastic element 150 may be arranged in an inclined or parallel manner with respect to the piezoelectric element 130. For example, as shown in FIG. 4, using the first connector 182 and the second connector 184, a plane where the first elastic element 140 and the second elastic element 150 are located may be parallel to a surface of the piezoelectric element 130. In this case, the elastic elements arranged inclined or parallel with respect to the piezoelectric element 130 may have elastic coefficient components in the vibration direction of the second vibration element 120 and in the direction perpendicular to the vibration direction of the second vibration element 120. Specifically, as shown in FIG. 5, the first elastic element 140 (not shown) may have the first elastic coefficient along the direction ZZ' perpendicular to the piezoelectric element 130 (or along the vibration direction of the second vibration element 120), and the first elastic element 140 may have the third elastic coefficient along the direction XX' parallel to the length of the piezoelectric element 130. The second elastic element 150 (not shown) may have the second elastic coefficient along the direction ZZ' perpendicular to the piezoelectric element 130 (or along the vibration direction of the second vibration element 120), and the second elastic element 150 may have the fourth elastic coefficient along the direction XX' parallel to the length of the piezoelectric element 130.

In some embodiments, when the first elastic element 140 transmits vibration, the first elastic coefficient may affect the displacement output of the first elastic element 140 in the ZZ' direction, and the third elastic coefficient may affect the displacement output of the first elastic element 140 in the XX' direction. Since the displacement output of the first elastic element 140 in the XX' direction may cause two ends of the first elastic element 140 (e.g., an elastic rod) to be pressed and have bending deformation, the elastic deformation in the direction XX' parallel to the length of the piezoelectric element 130 may produce displacement output in the direction ZZ' perpendicular to the piezoelectric element 130. In other words, the third elastic coefficient may affect the deformation ability of the first elastic element 140 in the ZZ' direction, thereby affecting the vibration output of the second vibration element 120 connected to the first elastic element 140. Similarly, when the second elastic element 150 transmits vibration, the displacement output of the second elastic element 150 in the XX' direction may cause the two ends of the second elastic element 150 to be pressed and have bending deformation, so that the elastic deformation in the direction XX' parallel to the length of the piezoelectric element 130 may produce displacement output in the direction ZZ' perpendicular to the piezoelectric element 130. In other words, the fourth elastic coefficient may affect the deformation ability of the second elastic element 150 in the ZZ' direction, thereby affecting the vibration output of the second vibration element 120 connected to the second elastic element 150. In some embodiments, the smaller the third elastic coefficient (or the fourth elastic coefficient), the greater the contribution of the third elastic coefficient (or the fourth elastic coefficient) to vibration transmission in the direction ZZ'.

Figure 8:
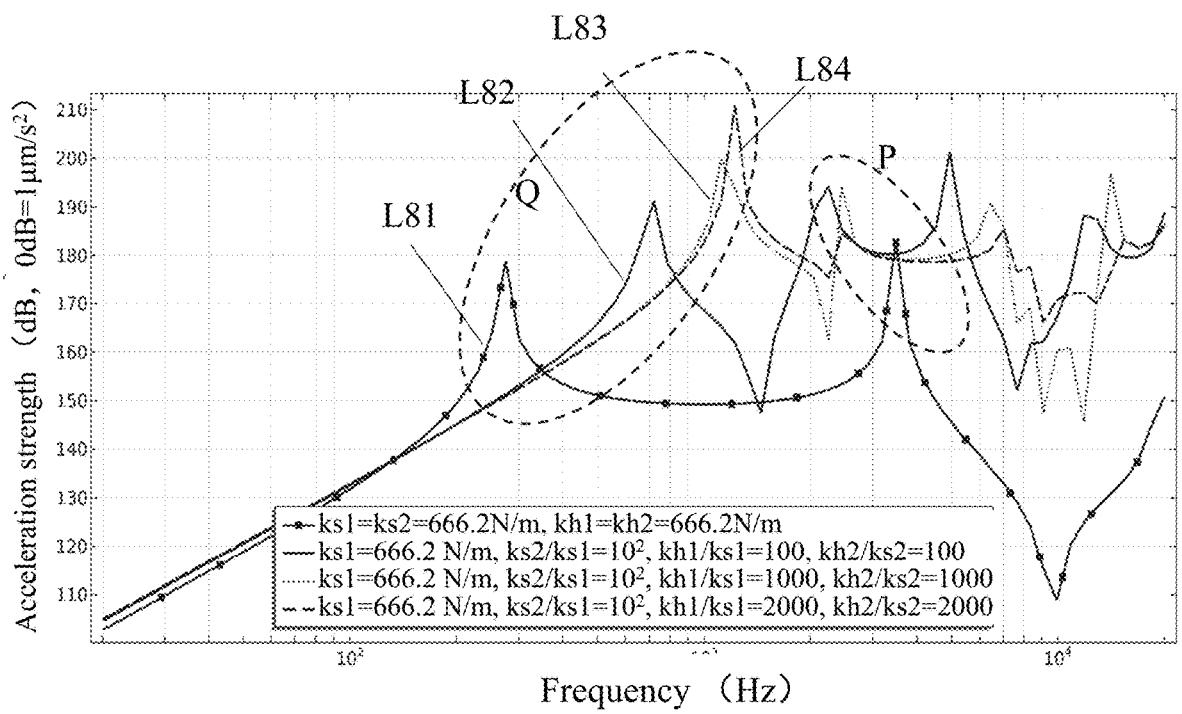
FIG. 8 illustrates frequency response curves of exemplary acoustic output devices when a vibration signal is output from an elastic mass end according to some embodiments of the present disclosure.

In order to ensure that the acoustic output device 400 has good sensitivity in the middle and high-frequency range (e.g., 1 kHz-10 kHz) (as shown in FIG. 8), in the vibration direction of the second vibration element 120 (or the piezoelectric element 130), the first elastic coefficient of the first elastic element 140 may be different from the second elastic coefficient of the second elastic element 150. For example, the second elastic coefficient may be greater or less than the first elastic coefficient. In the present disclosure, for the convenience of descriptions, the second elastic coefficient greater than the first elastic coefficient may be taken as an example. It should be noted that when the acoustic output device 400 vibrates, since the second elastic coefficient is greater than the first elastic coefficient, the second vibration element 120 may tilt and swing toward the first elastic element 140 or the second elastic element 150 while vibrating in the direction perpendicular to the surface of the piezoelectric element 130.

In some embodiments, the influence of the third elastic coefficient of the first elastic element 140 on the vibration output of the second vibration element 120 in the direction ZZ' perpendicular to the piezoelectric element 130 and the influence of the fourth elastic coefficient of the second elastic element 150 on the vibration output of the second vibration element 120 in the direction ZZ' perpendicular to the piezoelectric element 130 may be further adjusted to change the frequency response performance of the acoustic output device 400. In some embodiments, the third elastic coefficient of the first elastic element 140 and the fourth elastic coefficient of the second elastic element 150 may be equal or different. In some embodiments, a ratio of the third elastic coefficient to the first elastic coefficient of the first elastic element 140 and/or a ratio of the fourth elastic coefficient to the second elastic coefficient of the second elastic element 150 may be greater than $1\times10^4$. In some embodiments, the ratio of the third elastic coefficient to the first elastic coefficient of the first elastic element 140 and/or the ratio of the fourth elastic coefficient to the second elastic coefficient of the second elastic element 150 may be greater than $1\times10^5$. In some embodiments, the ratio of the third elastic coefficient to the first elastic coefficient of the first elastic element 140 and/or the ratio of the fourth elastic coefficient to the second elastic coefficient of the second elastic element 150 may be greater than $1\times10^6$. In some embodiments, the ratio of the third elastic coefficient to the first elastic coefficient of the first elastic element 140 and/or the ratio of the fourth elastic coefficient to the second elastic coefficient of the second elastic element 150 may be greater than $1\times10^7$.

In some embodiments, the first elastic element 140 may include one or more first elastic rods 142, and the second elastic element 150 may include one or more second elastic rods 152. In some embodiments, the first elastic rod 142 and/or the second elastic rod 152 may have a cylindrical shape, a cuboid shape, or any other suitable shape (e.g., a concave-convex structure as shown in FIG. 4). In some embodiments, the first elastic coefficient of the first elastic element 140 and the second elastic coefficient of the second elastic element 150 may be different by adjusting the count, length, material, structure, layout mode, etc., or any combination thereof, of the first elastic rod 142 and/or the second elastic rod 152.

In some embodiments, the count of the first elastic rods 142 and the count of the second elastic rods 152 may be the same or different. For example, when the configuration of each first elastic rod 142 is the same as the configuration of each second elastic rod 152 (e.g., with the same material, length, structure, etc.), the count of the first elastic rods 142 and the count of the second elastic rods 152 may be different. At this time, since the count of elastic rods included in the first elastic element 140 and the second elastic element 150 are different, their elastic coefficients (i.e., the first elastic coefficient and the second elastic coefficient) in the vibration direction of the second vibration element 120 are different. As another example, the count of the first elastic rods 142 and the count of the second elastic rods 152 may be the same (e.g., both them are two, three, four, etc.), and other characteristics (e.g., length, material, etc.) of each first elastic rod 142 may be different from other corresponding characteristics (e.g., length, material, etc.) of each second elastic rod 152 so that the first elastic coefficient of the first elastic element 140 and the second elastic coefficient of the second elastic element 150 are different. Merely by way of example, the first elastic coefficient of the first elastic element 140 and the second elastic coefficient of the second elastic element 150 may be different by making the material of each first elastic rod 142 different from the material of each second elastic rod 152. For example, the first elastic rod 142 may be made of a material with a small elastic modulus (e.g., silicone, foam, plastic, rubber, etc.), and the second elastic rod 152 may be made of a material with a large elastic modulus (e.g., metal, alloy, etc.).

In some embodiments, the first elastic coefficient of the first elastic element 140 and the second elastic coefficient of the second elastic element 150 may be different by changing the layout mode of the first elastic rods 142 and/or the second elastic rods 152. For example, when the configuration of each first elastic rod 142 is the same as the configuration of each second elastic rod 152 (e.g., have the same material, length, etc.), and the count of the first elastic rods 142 is the same as the count of the second elastic rods 152, the first elastic coefficient of the first elastic element 140 and the second elastic coefficient of the second elastic element 150 may set to be different by setting the included angle between every two adjacent first elastic rods 142 or the included angle between every two adjacent second elastic rods 152. For example, in order to make the second elastic coefficient greater than the first elastic coefficient, the included angle between every two adjacent second elastic rods 152 may be made less than the included angle between every two adjacent first elastic rods 142. In some embodiments, to minimize unnecessary shaking and offset caused by the asymmetric structure and avoid adverse effects on the output sound quality of the acoustic output device 400, the first elastic rods 142 may be symmetrically arranged with respect to a plane passing through the center of the piezoelectric element 130 and perpendicular to the surface of the piezoelectric element 130, and the second elastic rods 152 may also be symmetrically arranged with respect to a plane passing through the center of the piezoelectric element 130 and perpendicular to the surface of the piezoelectric element 130.

In some embodiments, the first elastic coefficient of the first elastic element 140 and the second elastic coefficient of the second elastic element 150 may be made different by making the lengths of each first elastic rod 142 and each second elastic rod 152 different. It should be noted that in the present disclosure, the length of the first elastic rod 142 may refer to the length of the first elastic rod 142 in a state not affected by an external force (i.e., a natural state), and the length of the second elastic rod 152 may refer to the length of the second elastic rod 152 in a state not affected by an external force. In some embodiments, the first elastic coefficient of the first elastic element 140 and the second elastic coefficient of the second elastic element 150 may be different by making each first elastic rod 142 and each second elastic rod 152 have different structures. For example, each first elastic rod 142 may have a concave-convex structure, and each second elastic rod 152 may have a cylindrical long rod structure.

Figure 6:
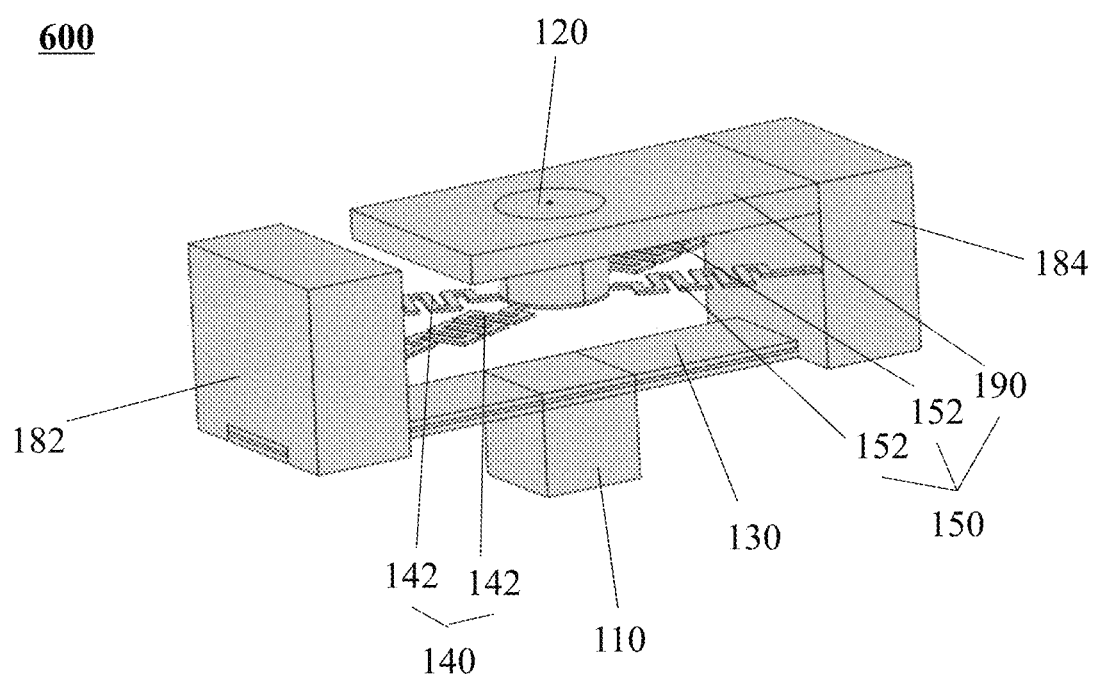
FIG. 6 is a schematic diagram illustrating a structure of an exemplary acoustic output device according to some embodiments of the present disclosure.
Figure 7:
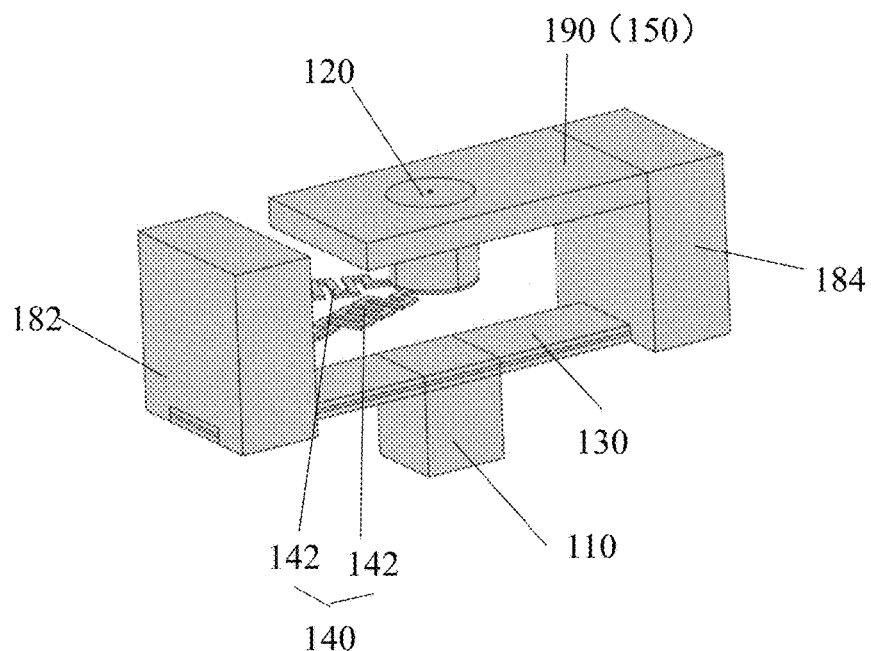
FIG. 7 is a schematic diagram illustrating a structure of another exemplary acoustic output device according to some embodiments of the present disclosure.

FIG. 6 is a schematic diagram illustrating a structure of an exemplary acoustic output device according to some embodiments of the present disclosure. FIG. 7 is a schematic diagram illustrating a structure of another exemplary acoustic output device according to some embodiments of the present disclosure. As shown in FIG. 6, the acoustic output device 600 may have a similar structure to the acoustic output device 400. The acoustic output device 600 differs from the acoustic output device 500 in that, in the acoustic output device 600, the second elastic element 150 may include a third connector 190 in addition to the second elastic rod 152. The second vibration element 120 may be further connected to the third position of the piezoelectric element 130 through the third connector 190.

In some embodiments, the third connector 190 may be a component made of any material. The third connector 190 and the second elastic rod 152 may jointly constitute the second elastic element 150. In other words, the elastic coefficient of the second elastic element 150 (e.g., the second elastic coefficient in the vibration direction of the second vibration element 120) may be provided by the third connector 190 and the second elastic rod 152. In some embodiments, when the second elastic rod 152 and the first elastic rod 142 have the same setting (e.g., the same structure, length, quantity, material, etc.), the second elastic coefficient of the second elastic element 150 may be made different from the first elastic coefficient of the first elastic element 140 by providing the third connector 190 (which may provide an additional elastic coefficient for the second elastic element 150).

In some embodiments, the difference between the second elastic coefficient of the second elastic element 150 and the first elastic coefficient of the first elastic element 140 may be adjusted by changing the structure, material, etc., of the third connector 190, so that the sensitivity of the acoustic output device 600 in different frequency bands may be improved to adapt to more application scenarios. In some embodiments, the third connector 190 may be in the shape of a sheet, a ring, a prism, a cuboid, a column, a ball, or any combination thereof, or may have another irregular shape. In some embodiments, the material of the third connector 190 may be silicone, foam, plastic, rubber, metal, etc., or any combination thereof.

In some embodiments, when the third connector 190 is made of a material with a large elastic modulus (e.g., metal, alloy, etc.), it is equivalent to that the second vibration element 120 and the piezoelectric element 130 are rigidly connected by the third connector 190. In this case, the second elastic rod 152 may be removed. As shown in the acoustic output device 700 in FIG. 7, the second vibration element 120 may be directly connected to the third position of the piezoelectric element 130 through the third connector 190. At this time, the third connector 190 may serve as the second elastic element 150. In some embodiments, to form a rigid connection between the second vibration element 120 and the second connector 184, the second elastic coefficient of the second elastic element 150 may be greater than $1\times10^4$ N/m. In some embodiments, to form a rigid connection between the second vibration element 120 and the second connector 184, the second elastic coefficient may be greater than $1\times10^5$ N/m. In some embodiments, to form a rigid connection between the second vibration element 120 and the second connector 184, the second elastic coefficient may be greater than $1\times10^6$ N/m. In some embodiments, to form a rigid connection between the second vibration element 120 and the second connector 184, the second elastic coefficient may be greater than $1\times10^7$ N/m.

In some embodiments, the first elastic element 140 may include a fourth connector (not shown), and the second vibration element 120 may further be connected to the second position of the piezoelectric element 130 through the fourth connector. In this case, the first elastic coefficient of the first elastic element 140 and the second elastic coefficient of the second elastic element 150 may be different by making the third connector 190 and the fourth connector different (e.g., different in structure, material, etc.).

FIG. 8 illustrates frequency response curves of exemplary acoustic output devices when a vibration signal is output by an elastic mass end according to some embodiments of the present disclosure. As shown in FIG. 8, curve L81 may represent a frequency response curve of the acoustic output device that the vibration signal is outputted from the elastic mass end when the first elastic coefficient ks1 of the first elastic element and the second elastic coefficient ks2 of the second elastic element are the same and are 666.2 N/m, and the third elastic coefficient kh1 of the first elastic element and the fourth elastic coefficient kh2 of the second elastic element are the same and are 666.2 N/m. Curve L82, curve L83, and curve L84 may represent frequency response curves of the acoustic output device (e.g., the acoustic output device 400) that the vibration signal is outputted from the elastic mass end when the first elastic coefficient of the first elastic element is 666.2 N/m and the ratio of the first elastic coefficient ks1 of the first elastic element to the second elastic coefficient ks2 of the second elastic element is 100. For the curve L82, the ratio of the third elastic coefficient kh1 to the first elastic coefficient ks1 of the first elastic element is 100, and the ratio of the fourth elastic coefficient kh2 to the second elastic coefficient ks2 of the second elastic element is 100. For the curve L83, the ratio of the third elastic coefficient kh1 to the first elastic coefficient ks1 of the first elastic element is 1000, and the ratio of the fourth elastic coefficient kh2 to the second elastic coefficient ks2 of the second elastic element is 1000. For the curve L84, the ratio of the third elastic coefficient kh1 to the first elastic coefficient ks1 of the first elastic element is 2000, and the ratio of the fourth elastic coefficient kh2 to the second elastic coefficient ks2 of the second elastic element is 2000.

As shown in FIG. 8, the curves L81, L82, L83, and L84 may all have two resonance peaks in the range of 100 Hz to 5000 Hz (which is within the audible range of human ears). The first resonance peak in the dotted circle Q may be generated by resonance of the second vibration element 120, the first elastic element 140, and the second elastic element 150. The second resonance peak in the dotted circle P may be generated by the resonance of the first vibration element 110 and the piezoelectric element 130. As can be seen from FIG. 8, when the first elastic coefficient ks1 of the first elastic element 140 is equal to the second elastic coefficient ks2 of the second elastic element 150, and the third elastic coefficient kh1 of the first elastic element is equal to the fourth elastic coefficient kh2 of the second elastic element (corresponding to the curve L81), the curve between the first resonance peak and the second resonance peak may be flat without peak or valley, but its sensitivity may be low. Keeping the first elastic coefficient ks1 unchanged and increasing the second elastic coefficient ks2 as 100 times the first elastic coefficient ks1, in other words, the acoustic output device 400 changes from an elastically symmetric acoustic output device (corresponding to the curve L81) to an elastically asymmetric acoustic output device (e.g., corresponding to the curves L82, L83, and L84), the first resonance frequency corresponding to the first resonance peak (resonance peaks in the dotted circle Q) of the acoustic output device 400 may increase, and after the first resonance peak, a resonance valley (i.e., a resonance valley in the dotted circle P) may be generated.

Further, as shown in the curves L82 to L84, since the third elastic coefficient kh1 of the first elastic element and the fourth elastic coefficient kh2 of the second elastic element may affect the vibration output of the second vibration element 120, when the third elastic coefficient kh1 of the first elastic element 140 and the fourth elastic coefficient kh2 of the second elastic element 150 are gradually increased (corresponding to the curves L82 to L84), the first resonance frequency corresponding to the first resonance peak and the frequency corresponding to the following resonance valley gradually move to the high frequency at the same time. The frequency response amplitude before the first resonance peak may slightly increase, and the frequency response amplitude after the second resonance peak may significantly increase. In other words, the acoustic output device 400 may have a higher sensitivity in the middle and high-frequency band (for example, 1 kHz-10 kHz). When the third elastic coefficient kh1 of the first elastic element 140 is increased to 2000 times the first elastic coefficient ks1, and the fourth elastic coefficient kh2 of the second elastic element 150 is increased to 2000 times the second elastic coefficient ks2, the first resonance valley after the first resonance peak and the second resonance peak produce an obvious cancellation effect (corresponding curve L84), thereby flattening the frequency response of the corresponding acoustic output device. As the difference between the second elastic coefficient ks2 and the first elastic coefficient ks1 increases, the sensitivity of the acoustic output device 200 in the middle and high-frequency band may improve. In some embodiments, when the difference between the second elastic coefficient ks2 and the first elastic coefficient ks1 exceeds a certain value (e.g., the ratio between the second elastic coefficient ks2 and the first elastic coefficient ks1 is more than 1000), the frequency response of the acoustic output device 200 in the middle and high-frequency band may be basically unchanged, that is, the sensitivity of the acoustic output device 200 in the middle and high-frequency band may not continue to improve.

To sum up, when the second elastic coefficient ks2 and the first elastic coefficient ks1 are different, the acoustic output device 400 may have the higher sensitivity in the middle and high-frequency band. When the first elastic coefficient ks1 and the second elastic coefficient ks2 are kept unchanged, with the increase of the third elastic coefficient kh1 and the fourth elastic coefficient kh2, the sensitivity of the acoustic output device 400 in the middle and high-frequency band may be improved, and the frequency response curve in the middle and high-frequency band may be flatter. In some embodiments, to improve the sensitivity of the acoustic output device 400 in the frequency band of 500 Hz-3000 Hz, the difference between the second elastic coefficient ks2 and the first elastic coefficient ks1 may be set in a range of $10^3$ N/m-$10^4$ N/m, meanwhile, the third elastic coefficient kh1 may be set in a range of $10^3$ N/m-$10^4$ N/m, and the fourth elastic coefficient kh2 may be set in a range of $10^5$ N/m-$10^6$ N/m. In some embodiments, to improve the sensitivity of the acoustic output device 400 in the frequency band of 1500 Hz-7000 Hz and the flatness of the frequency response in the frequency band, the difference between the second elastic coefficient ks2 and the first elastic coefficient ks1 may be set in a range of $10^3$ N/m-$10^4$ N/m, the third elastic coefficient kh1 may be set in a range of $10^5$ N/m-$10^7$ N/m, and the fourth elastic coefficient kh2 may be set in a range of $10^5$ N/m-$10^9$ N/m.

The basic concepts have been described above, apparently, for those skilled in the art, the above-mentioned detailed disclosure is only used as an example, and it does not constitute a limitation of the present disclosure. Various modifications, improvements, and corrections may occur and be intended for those skilled in the art, though not expressly stated herein. Such modifications, improvements, and corrections are suggested in the present disclosure, so such modifications, improvements, and corrections still belong to the spirit and scope of the exemplary embodiments of the present disclosure.

At the same time, the present disclosure uses specific words to describe the embodiments of the present disclosure. For example, "one embodiment," "an embodiment," and/or "some embodiments" mean that a certain feature, structure, or characteristic is connected with at least one embodiment of the present disclosure. Therefore, it should be emphasized and noted that "an embodiment," "one embodiment," or "an alternative embodiment" mentioned twice or more in different positions in the present disclosure does not necessarily refer to the same embodiment. In addition, some features, structures, or characteristics of one or more embodiments in the present disclosure may be properly combined.

Moreover, unless otherwise specified in the claims, the sequence of the present disclosure, the order of the sequence of the present disclosure, the use of digital letters, or other names are not used to define the order of the present disclosure processes and methods. Although the above disclosure discusses through various examples what is currently considered to be a variety of useful embodiments of the disclosure, it is to be understood that such detail is solely for that purpose of description and that the appended claims are not limited to the disclosed embodiments, on the contrary, are intended to cover modifications and equivalent combination s that are within the spirit and scope of the embodiments of the present disclosure. For example, although the implementation of various components described above may be embodied in a hardware device, it may also be implemented as a software only solution, e.g., an installation on an existing server or mobile device.

Similarly, it should be noted that in order to simplify the expression disclosed in the present disclosure and help the understanding of one or more invention embodiments, in the previous description of the embodiments of the present disclosure, a variety of features are sometimes combined into one embodiment, drawings or description thereof. However, the present disclosure method does not mean that the features needed in the spectrum ratio of this disclosure ratio are more features. Rather, claimed subject matter may lie in less than all features of a single foregoing disclosed embodiment.

Some embodiments use numbers with description ingredients and attributes. It should be understood that the number described by such examples is used in some examples with the modified words "about," "approximate" or "generally" to modify. Unless otherwise stated, "about," "approximate," or "generally" may indicate a ±20% variation of the value it describes. Accordingly, in some embodiments, the numerical parameters used in the present disclosure and claims are approximate values, and the approximate values may be changed according to the required characteristics of individual embodiments. In some embodiments, the specified significant digits shall be considered for the numerical parameters and the general number of digits shall be reserved. Although in some embodiments of the present disclosure, the numerical domain and parameters used to confirm the range of its scope are approximate values, the setting of such values may be as precise as possible within the feasible range in specific embodiments.

Finally, it should be understood that the embodiments described in the present disclosure are only used to illustrate the principles of the embodiments of the present disclosure. Other modifications may also fall within the scope of the present disclosure. Therefore, by way of example and not limitation, the alternative configurations of the embodiments of the present disclosure can be regarded as consistent with the teachings of the present disclosure. Accordingly, the embodiments of the present disclosure are not limited to those explicitly introduced and described in the disclosure.

What is claimed is:

1. An acoustic output device, including:
    a first vibration element;
    a second vibration element; and
    a piezoelectric element, the piezoelectric element driving the first vibration element and the second vibration element to vibrate in response to an electrical signal, wherein
    the first vibration element is connected to a first position of the piezoelectric element,
    the second vibration element is connected to a second position of the piezoelectric element through at least a first elastic element,
    the second vibration element is connected to a third position of the piezoelectric element through at least a second elastic element, and
    in a vibration direction of the second vibration element, a first elastic coefficient of the first elastic element is different from a second elastic coefficient of the second elastic element.

2. The acoustic output device of claim 1, further including:
    a first connector and a second connector, wherein
        the first elastic element is connected to the second position of the piezoelectric element through the first connector, and
        the second elastic element is connected to the third position of the piezoelectric element through the second connector.

3. The acoustic output device of claim 1, wherein the first elastic element includes one or more first elastic rods, and the second elastic element includes one or more second elastic rods.

4. The acoustic output device of claim 3, wherein a count of the one or more first elastic rods is the same as a count of the one or more second elastic rods.

5. The acoustic output device of claim 3, wherein a length of each first elastic rod of the one or more first elastic rods is different from a length of each second elastic rod of the one or more second elastic rods.

6. The acoustic output device of claim 3, wherein a material of the one or more first elastic rods is different from a material of the one or more second elastic rods.

7. The acoustic output device of claim 3, wherein an included angle of every two adjacent first elastic rods in the one or more first elastic rods is different from an included angle of every two adjacent second elastic rods in the one or more second elastic rods.

8. The acoustic output device of claim 3, wherein the configuration of each first elastic rod of the one or more first elastic rods is the same as the configuration of each second elastic rod of the one or more second elastic rods, and a count of the one or more first elastic rods is different from a count of the one or more second elastic rods.

9. The acoustic output device of claim 3, wherein the second elastic element further includes a third connector, and
    the second vibration element is further connected to the third position of the piezoelectric element through at least the third connector.

10. The acoustic output device of claim 1, wherein the first elastic element includes one or more first elastic rods, the second elastic element includes a third connector, and
    the second vibration element is connected to the third position of the piezoelectric element through the third connector.

11. The acoustic output device of claim 1, wherein the first elastic coefficient of the first elastic element is less than the second elastic coefficient of the second elastic element, and the second elastic coefficient of the second elastic element is larger than $1 \times 10^4$ N/m.

12. The acoustic output device of claim 1, wherein a ratio of the second elastic coefficient of the second elastic element to the first elastic coefficient of the first elastic element is greater than 10.

13. The acoustic output device of claim 12, wherein
    in a direction perpendicular to the vibration direction of the second vibration element, the first elastic element has a third elastic coefficient, and a ratio of the third elastic coefficient to the first elastic coefficient is greater than $1 \times 10^4$; or
    in a direction perpendicular to the vibration direction of the second vibration element, the second elastic element has a fourth elastic coefficient, and a ratio of the fourth elastic coefficient to the second elastic coefficient is greater than $1 \times 10^4$.

14. The acoustic output device of claim 1, wherein the vibration of the first vibration element and the second vibration element generate two resonance peaks within an audible range of a human ear.

15. The acoustic output device of claim 14, wherein the second vibration element, the first elastic element, and the second elastic element resonate to generate a resonance peak having a lower frequency among the two resonance peaks, and
    the piezoelectric element and the first vibration element resonate to generate a resonance peak having a higher frequency among the two resonance peaks.

16. The acoustic output device of claim 15, wherein a frequency of the peak having the lower frequency among the two resonance peaks is in a range of 50 Hz-2 kHz, and a frequency of the peak having the higher frequency among the two resonance peaks is in a range of 1 kHz-10 KHz.

17. The acoustic output device of claim 1, wherein the piezoelectric element includes a beam-like structure, and the first position is located at the center of a length-extension direction of the beam-like structure.

18. The acoustic output device of claim 17, wherein the second position and the third position are located at two ends of the length-extension direction of the beam-like structure, respectively.

19. The acoustic output device of claim 1, wherein the vibration is transmitted to a user in a bone conduction manner through the second vibration element.

20. The acoustic output device of claim 1, wherein a length of the piezoelectric element is in a range of 3 mm to 30 mm.

* * * * *